(12) United States Patent
Fujioka et al.

(10) Patent No.: US 7,750,233 B2
(45) Date of Patent: Jul. 6, 2010

(54) THIN FILM SOLAR CELL AND MANUFACTURING METHOD THEREOF

(75) Inventors: Yasushi Fujioka, Soraku-gun (JP); Tohru Takeda, Kashiba (JP)

(73) Assignee: Sharp Kabushiki Kaisha, Osaka (JP)

( * ) Notice: Subject to any disclaimer, the term of this patent is extended or adjusted under 35 U.S.C. 154(b) by 1126 days.

(21) Appl. No.: 11/367,428

(22) Filed: Mar. 6, 2006

(65) Prior Publication Data

US 2006/0196536 A1    Sep. 7, 2006

(30) Foreign Application Priority Data

Mar. 7, 2005    (JP) .............................. 2005-062816

(51) Int. Cl.
*H01L 25/00* (2006.01)
(52) U.S. Cl. ...................... 136/243; 136/244; 136/246; 136/249; 136/259; 257/458; 257/459
(58) Field of Classification Search ................ 136/243, 136/244, 246, 249, 259; 257/458, 459
See application file for complete search history.

(56) References Cited

U.S. PATENT DOCUMENTS 6,858,461 B2    2/2005    Oswald et al.

FOREIGN PATENT DOCUMENTS

| JP | 6-60155 | U | 8/1994 |
|---|---|---|---|
| JP | 11-312816 | A | 11/1999 |
| JP | 2001-068713 | | 3/2001 |
| JP | 2002-111022 | A | 4/2002 |
| JP | 2002-124689 | A | 4/2002 |
| JP | 2002-124690 | | 4/2002 |
| JP | 2002-299663 | | 10/2002 |
| JP | 2004-503112 | A | 1/2004 |
| JP | 2004-124689 | A | 4/2004 |
| JP | 2004-186443 | A | 7/2004 |
| JP | 2004-330271 | A | 11/2004 |

*Primary Examiner*—Alexa D Neckel
*Assistant Examiner*—Xiuyu Tai
(74) *Attorney, Agent, or Firm*—Nixon & Vanderhye, P.C.

(57) ABSTRACT

A thin film solar cell includes: a transparent conductive film arranged on a translucent insulating substrate; first and second separation trenches orthogonal to each other on the translucent insulating substrate and separating the transparent conductive film; and a first opening trench parallel to the first separation trench and second opening trenches parallel to said second separation trench, orthogonal to each other on the translucent insulating substrate; wherein solar cells formed on the translucent insulating substrate are arranged at adjacent positions with said first opening trench positioned therebetween and at adjacent positions with said second opening trench positioned therebetween; pairs of said solar cells adjacent to each other with said first opening trench positioned therebetween are electrically connected, and among pairs of solar cells positioned adjacent to each other with the second opening trench in between, some are electrically connected to each other, and others are electrically insulated from each other. Method of manufacturing the thin film solar cell is also provided.

5 Claims, 5 Drawing Sheets

YAG FUNDAMENTAL WAVE LASER BEAM

YAG SECOND HARMONIC LASER BEAM    YAG SECOND HARMONIC LASER BEAM

THIN FILM SOLAR CELL AND MANUFACTURING METHOD THEREOF

This nonprovisional application is based on Japanese Patent Application No. 2005-062816 filed with the Japan Patent Office on Mar. 7, 2005, the entire contents of which are hereby incorporated by reference.

BACKGROUND OF THE INVENTION

1. Field of the Invention

The present invention relates to a thin film solar cell and a method of manufacturing the same. Particularly, the present invention relates to a thin film solar cell realizing high production yield and suppressing degradation in conversion efficiency even when a short-circuit occurs in a photoelectric conversion layer, as well as to a method of manufacturing the same.

2. Description of the Background Art

FIG. 7 is a schematic perspective cross-sectional view showing a part of a conventional thin film solar cell. In the thin film solar cell, on a translucent insulating substrate 1 such as a glass substrate, a strip-shaped transparent conductive film 2 is formed, and on transparent conductive film 2, solar cells 10 and 11 are formed, which cells include a strip-shaped photoelectric conversion layer 3 formed of a p-layer, an i-layer and an n-layer of amorphous silicon thin films stacked successively by a known plasma CVD method or the like, and a back surface electrode 4. Transparent conductive film 2 is separated by a first separation trench 5, the first solar cell 10 and the second solar cell 11 are positioned side by side with a first opening trench 7 for passing light positioned therebetween, and transparent conductive film 2 of the first solar cell 10 is electrically connected in series with back surface electrode 4 of the second solar cell 11, through a connecting trench 6.

In the thin film solar cell having such a structure, the surface can be protected by translucent insulating substrate 1. Further, thanks to development of a plasma-resistant transparent conductive film such as $SnO_2$, it becomes possible to form an amorphous silicon thin film by plasma CVD method. Therefore, the thin film solar cell of this type comes to be widely used, and is dominant at present.

FIG. 6 is a schematic perspective view showing an appearance of the thin film solar cell of FIG. 7. In the thin film solar cell, in order to further improve light transmittance, second opening trenches 8 orthogonal to the first opening trench 7 may be provided, as shown in the schematic perspective view of FIG. 3. In the thin film solar cell shown in FIG. 3, the current is taken out by a lead 9.

SUMMARY OF THE INVENTION

The thin film solar cell such as shown in FIGS. 6 and 7 is disclosed, for example, in Japanese Patent Laying-Open No. 2002-299663 (Reference 1). When a short-circuit occurs in a photoelectric conversion layer, photocurrent tends to concentrate on the portion of short-circuit. Therefore, the thin film solar cell shown in FIGS. 6 and 7, which has a plurality of solar cells connected in series by the transparent conductive layer, has a problem that the overall conversion efficiency lowers significantly.

In view of the foregoing, Japanese Patent Laying-Open No. 2002-124690 (Reference 2) discloses a method of reducing the influence of possible short-circuit in the photoelectric conversion layer of the solar cell on the overall conversion efficiency of the thin film solar cell, by separating, in the thin film solar cell having the structure shown in FIG. 3, every transparent conductive film between solar cells positioned next to each other with the second opening trench 8 positioned therebetween. According to the method of Reference 2, the second opening trench is formed by separating, at one time, the transparent conductive film, the photoelectric conversion layer and the back surface electrode while leaving no residue possibly resulting from sublimation of the transparent conductive film, by delicately controlling an output of an YAG (Yttrium-Aluminum-Garnet) fundamental wave laser beam used for laser scribing. Adjustment of the output of YAG fundamental wave laser beam, however, is difficult, and therefore, process condition is very severe, resulting in a problem of lower production yield. Specifically, the condition of YAG fundamental wave laser beam that can separate the transparent conductive film, the photoelectric conversion layer and the back surface electrode at one time is very strict, and therefore, it is extremely difficult to form the second opening trench. If the output of YAG fundamental wave laser beam were too high, sublimated transparent conductive film would re-attach, causing short-circuit, and if the output were too low, the second opening trench would not be formed. A method may be possible in which the transparent conductive film is separated in advance by laser scribing using the YAG fundamental wave laser beam, and after forming the photoelectric conversion layer, the photoelectric conversion layer is separated by a visible laser beam. Such a method, however, requires long processing time, and further, it is very difficult to register thin separation lines using separate laser processing apparatuses.

In view of the foregoing, an object of the present invention is to provide a thin film solar cell realizing high production yield and suppressing degradation in conversion efficiency even when short-circuit occurs in a photoelectric conversion layer, as well as to provide a method of manufacturing the same.

The present invention provides a thin film solar cell, including: a transparent conductive film arranged on a translucent insulating substrate; first and second separation trenches orthogonal to each other on the translucent insulating substrate and separating the transparent conductive film into a plurality of pieces; and at least one first opening trench parallel to the first separation trench and at least two second opening trenches parallel to the second separation trench, orthogonal to each other on the translucent insulating substrate; wherein solar cells including a photoelectric conversion layer and a back surface electrode formed on the translucent insulating substrate are arranged at adjacent positions with the first opening trench positioned therebetween and at adjacent positions with the second opening trench positioned therebetween; pairs of the solar cells adjacent to each other with the first opening trench positioned therebetween are electrically connected as the photoelectric conversion layer of one solar cell and the back surface electrode of the other solar cell are in contact with the transparent conductive film; and pairs of solar cells positioned adjacent to each other with the second opening trench positioned therebetween include pairs of solar cells that are electrically connected to each other with the transparent conductive film in contact with the photoelectric conversion layer of one solar cell and the transparent conductive film in contact with the photoelectric conversion layer of the other solar cell being not separated by the second separation trench, and pairs of solar cells that are electrically insulated from each other with the transparent conductive film in contact with the photoelectric conversion layer of one solar cell and the transparent conductive film in contact with the photoelectric conversion layer of the other solar cell being separated by the second separation trench. In the present invention, the first separation trench may be at least partially filled with the photoelectric conversion layer or the like, as long as the transparent conductive film can be physically separated. Further, in the present invention, the second separation trench may be at least partially filled with the photoelectric conversion layer or the like, as long as the transparent conductive film can be physically separated.

In the thin film solar cell in accordance with the present invention, the photoelectric conversion layer may include a layer of micro-crystal silicon.

Further, in the thin film solar cell in accordance with the present invention, the photoelectric conversion layer may have a tandem structure including a layer of amorphous silicon and a layer of micro-crystal silicon.

Further, in the thin film solar cell in accordance with the present invention, the first separation trench and the first opening trench are provided at positions not overlapping with each other, and the second separation trench and the second opening trench may be provided at overlapping positions.

Further, in the thin film solar cell in accordance with the present invention, the width of the second separation trench may be different from the width of the second opening trench.

The present invention also provides a method of manufacturing any of the above-described thin film solar cells, including the steps of: forming the transparent conductive film on the translucent insulating substrate; forming the first and second separation trenches by removing parts of the transparent conductive film in a plurality of strips orthogonal to each other; forming the photoelectric conversion layer and the back surface electrode in this order on the transparent conductive film and on the first and second separation trenches; and forming the first and second opening trenches by removing a part of the photoelectric conversion layer and a part of the back surface electrode layer in a plurality of strips orthogonal to each other.

Here, in the method of manufacturing the thin film solar cell in accordance with the present invention, the width of the second separation trench may be wider than width of the second opening trench.

The present invention further provides a method of manufacturing any of the above-described thin film solar cells, including the steps of forming the transparent conductive film on the translucent insulating substrate; forming the first separation trench by removing a part of the transparent conductive film in a strip; forming the photoelectric conversion layer and the back surface electrode in this order on the transparent conductive film and on the first separation trench, forming the first and second opening trenches by removing a part of the photoelectric conversion layer and a part of the back surface electrode in a plurality of strips orthogonal to each other; and forming the second separation trench by removing, in a strip, at least a part of a surface of the transparent conductive film exposed in the second opening trench.

In the method of manufacturing the thin film solar cell in accordance with the present invention, the width of the second separation trench may be made narrower than the width of the second opening trench.

Further, in the method of manufacturing the thin film solar cell in accordance with the present invention, the transparent conductive film may be removed by laser scribing using YAG fundamental wave laser beam, and the photoelectric conversion layer and the back surface electrode may be removed by laser scribing using YAG second harmonic laser beam.

Thus, by the present invention, a thin film solar cell realizing high production yield and suppressing degradation in conversion efficiency even when a short-circuit occurs in a photoelectric conversion layer, as well as a method of manufacturing the same, can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
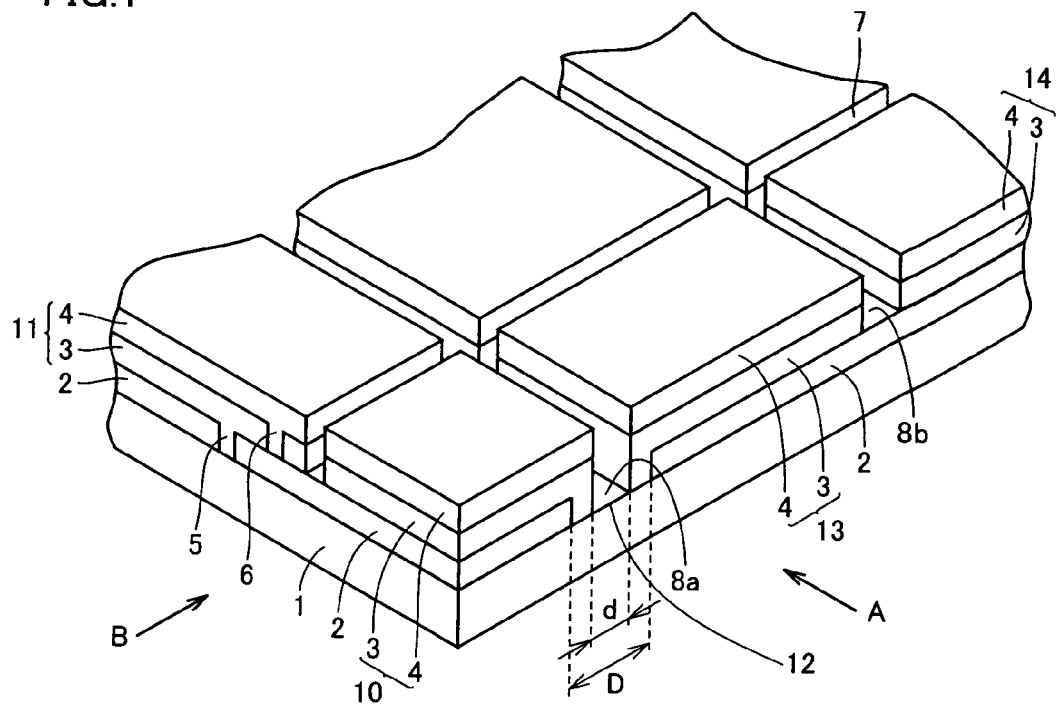
FIG. 1 is a schematic perspective cross-sectional view of a part of a preferred example of the thin film solar cell in accordance with the present invention.

Embodiments of the present invention will be described in the following. Throughout the figures of the invention, the same reference characters denote the same or corresponding portions.

FIG. 1 is a schematic perspective cross-sectional view showing a part of a preferred example of the thin film solar cell in accordance with the present invention. The thin film solar cell includes a translucent insulating substrate 1, and a transparent conductive film 2 formed on translucent insulating substrate 1. On translucent insulating substrate 1, a first separation trench 5 (formed in the direction of an arrow B in FIG. 1) and a second separation trench 12 (formed in the direction of an arrow A in FIG. 1) are formed, orthogonal to each other and separating transparent conductive film 2 into a plurality of pieces. Further, on translucent insulating substrate 1, a first opening trench 7 parallel to the first separation trench 5 and second opening trenches 8a, 8b parallel to the second separation trench 12 are formed. Here, the first opening trench 7 and the second opening trenches 8a, 8b are orthogonal to each other.

Further, solar cells 10 and 11 are arranged adjacent to each other, with the first opening trench 7 in between. Further, solar cells 10 and 13 are arranged adjacent to each other, with the second opening trench 8a in between, and solar cells 13 and 14 are arranged adjacent to each other, with the second opening trench 8b in between. Here, solar cells 10, 11, 13 and 14 are each formed of a photoelectric conversion layer 3 and a back surface electrode 4 formed on translucent insulating substrate 1.

The pair of solar cells 10 and 11 positioned adjacent to each other with the first opening trench 7 positioned therebetween are electrically connected, as photoelectric conversion layer 3 of solar cell 10 and back surface electrode 4 of solar cell 11 are each in contact with transparent conductive film 2. Here, back surface electrode 4 of solar cell 11 is brought into contact with transparent conductive film 2 by filling a connection trench 6.

The pair of solar cells 10 and 13 positioned adjacent to each other with the second opening trench 8a positioned therebetween are electrically insulated, as transparent conductive film 2 in contact with photoelectric conversion layer 3 of solar cell 10 is separated by the second separation trench 12 from transparent conductive film 2 in contact with photoelectric conversion layer 3 of solar cell 13. Further, the pair of solar cells 13 and 14 positioned adjacent to each other with the second opening trench 8b positioned therebetween are electrically connected, as transparent conductive film 2 in contact with photoelectric conversion layer 3 of solar cell 13 is not separated by the second separation trench from transparent conductive film 2 in contact with photoelectric conversion layer 3 of solar cell 14. Therefore, in the thin film solar cell, among pairs of solar cells positioned adjacent to each other with the second opening trench in between, some are electrically connected to each other with the transparent conductive film not separated by the second separation trench, and others are electrically insulated from each other with the transparent conductive film separated by the second separation trench.

In the thin film solar cell described in prior art Reference 2, the transparent conductive film between every pair of solar cells positioned adjacent to each other with the second opening trench positioned therebetween is separated by the second separation trench, and electrically insulated. The inventor of the present invention found that the degree of degradation in conversion efficiency caused by a short-circuit in the photoelectric conversion layer, resulted by separating only a part of the transparent conductive film between pairs of solar cells positioned adjacent to each other with the second opening trench positioned therebetween, is approximately the same as the degree of degradation experienced in the thin film solar cell described in Reference 2, and the invention was made based on the finding. Consequently, the number of forming the separation trenches, which has been a major cause of lower production yield, can be reduced as compared with the technique described in Reference 2. Therefore, the thin film solar cell in accordance with the present invention attains higher production yield than the thin film solar cell of Reference 2.

In the thin film solar cell in accordance with the present invention shown in FIG. 1, the first separation trench 5 and the first opening trench 7 are provided at positions not overlapping with each other, while the second separation trench 12 and the second opening trench 8a are provided at overlapping positions, as the second opening trench 8a is formed in the second separation trench 12. Further, the second separation trench 12 has a width D that is wider than the width d of the second opening trench 8a. The first separation trench 5 and the second separation trench 12 each have a cross section of transparent conductive film 2 as a side wall, while the first separation trench 7 and the second separation trenches 8a, 8b each have cross sections of photoelectric conversion layer 3 and back surface electrode 4 as a side wall.

Here, it is noted that translucent insulating substrate 1 has both insulating characteristic and light transmitting characteristic. As the insulating substrate 1, a glass substrate, for example, may be used. As transparent conductive film 2, by way of example, $SnO_2$ (tin oxide), ITO (Indium Tin Oxide) or ZnO (zinc oxide) may be used.

As photoelectric conversion layer 3, a structure having p-layer, i-layer and n-layer of amorphous silicon thin films stacked successively, a structure having p-layer, i-layer and n-layer of micro-crystal silicon thin films stacked successively, or a tandem structure combining the structure having p-layer, i-layer and n-layer of amorphous silicon thin films stacked successively and the structure having p-layer, i-layer and n-layer of micro-crystal silicon thin films stacked successively, may be used.

Further, as back surface electrode 4, a metal thin film of silver or aluminum or a transparent conductive film such as ZnO, formed by known sputtering method or the like, may be used.

Figure 4A:
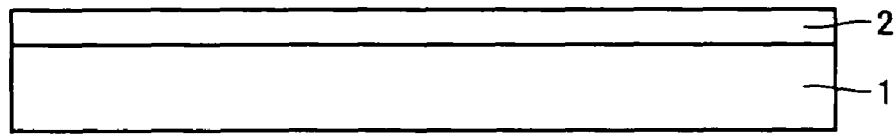
FIGS. 4A to 4D are schematic side views showing exemplary steps of manufacturing the thin film solar cell in accordance with the present invention.
Figure 4B:
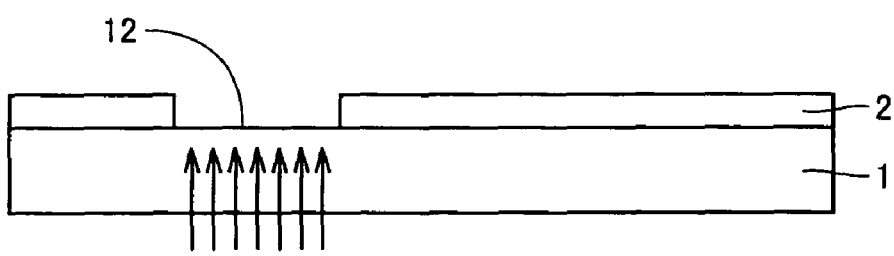

FIGS. 4A to 4D are schematic side views showing exemplary steps of manufacturing the thin film solar cell in accordance with the present invention. FIGS. 4A to 4D are schematic side views taken from the direction of arrow A of FIG. 1. First, as shown in FIG. 4A, on translucent insulating substrate 1, transparent conductive film 2 is formed. Here, the method of forming transparent conductive film 2 is not specifically limited and, by way of example, a known sputtering method may be used. Next, as shown in FIG. 4B, a part of transparent conductive film 2 is removed in a strip by laser scribing, by a YAG fundamental wave laser beam (wavelength: 1064 nm) directed from the side of translucent insulating substrate 1, so that transparent conductive film 2 is separated and the second separation trench 12 is formed. Here, also along the direction of arrow B shown in FIG. 1, a part of transparent conductive film 2 is removed in a strip by laser scribing, by a YAG fundamental wave laser beam, so that transparent conductive film 2 is separated and the first separation trench 5 shown in FIG. 1 is formed.

Figure 4C:
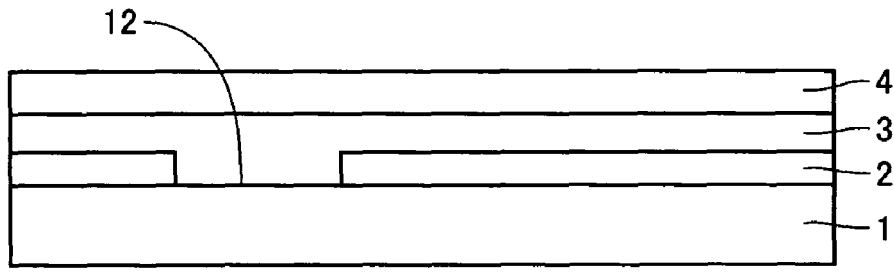

Thereafter, as shown in FIG. 4C, on transparent conductive film 2, first separation trench 5 and second separation trench 12, photoelectric conversion layer 3 and back surface electrode 4 are formed successively. Here, along the direction of arrow B shown in FIG. 1, after forming photoelectric conversion layer 3 and before forming back surface electrode 4, a part of photoelectric conversion layer 3 is removed in a strip by laser scribing, by a YAG second harmonic laser beam (wavelength: 532 nm), so that connection trench 6 shown in FIG. 1 is formed. The method of forming photoelectric conversion layer 3 and the method of forming back surface electrode 4 are not specifically limited. By way of example, a known plasma CVD method such as high frequency glow discharge plasma CVD may be used for forming photoelectric conversion layer 3, and a known sputtering method such as DC magnetron sputtering may be used for forming back surface electrode 4.

Figure 4D:
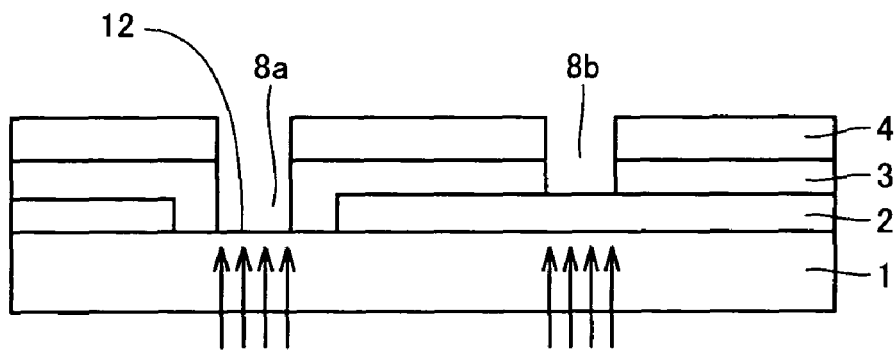

Then, as shown in FIG. 4D, by irradiation of YAG second harmonic laser beam from the side of translucent insulating substrate 1, a part of photoelectric conversion layer 3 and a part of back surface electrode 4 are removed in strips by laser scribing, so that a surface of transparent conductive film 2 is exposed and photoelectric conversion layer 3 and back surface electrode 4 are each separated. Consequently, second opening trenches 8a and 8b are formed. Finally, by irradiation of YAG second harmonic laser beam from the side of translucent insulating substrate 1 in a direction orthogonal to the second opening trenches 8a, 8b, a part of photoelectric conversion layer 3 and a part of back surface electrode 4 are further removed in strips, and photoelectric conversion layer 3 and back surface electrode 4 are each separated. Consequently, the first opening trench 7 orthogonal to the second opening trenches 8a, 8b is formed, and the thin film solar cell shown in FIG. 1 is completed.

As described above, different from the method described in Reference 2, in the present invention, the first separation trench, the second separation trench, the first opening trench and the second opening trench are formed not only by the YAG fundamental wave laser beam. Therefore, it becomes less likely that the residue of transparent conductive film generated by sublimation adheres to the cross section of the photoelectric conversion layer or back surface electrode, and hence, rate of insufficient insulation occurring between the transparent conductive film and the photoelectric conversion layer and between the transparent conductive film and the back surface electrode can be reduced.

Figure 2:
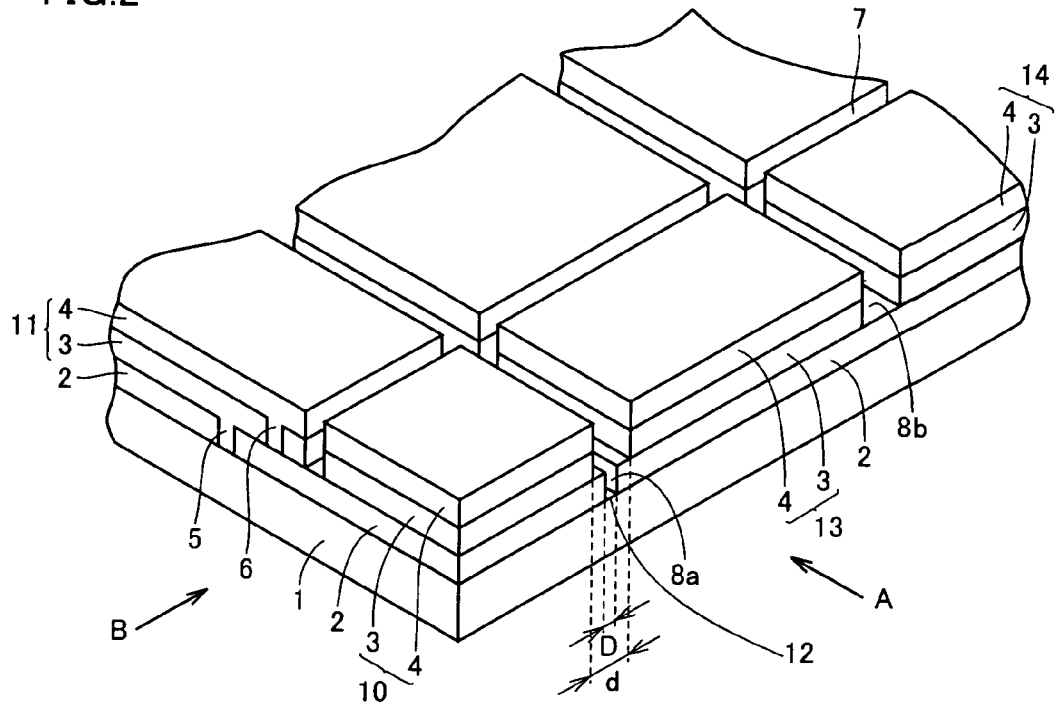
FIG. 2 is a schematic perspective cross-sectional view of a part of another preferred example of the thin film solar cell in accordance with the present invention.
Figure 3:
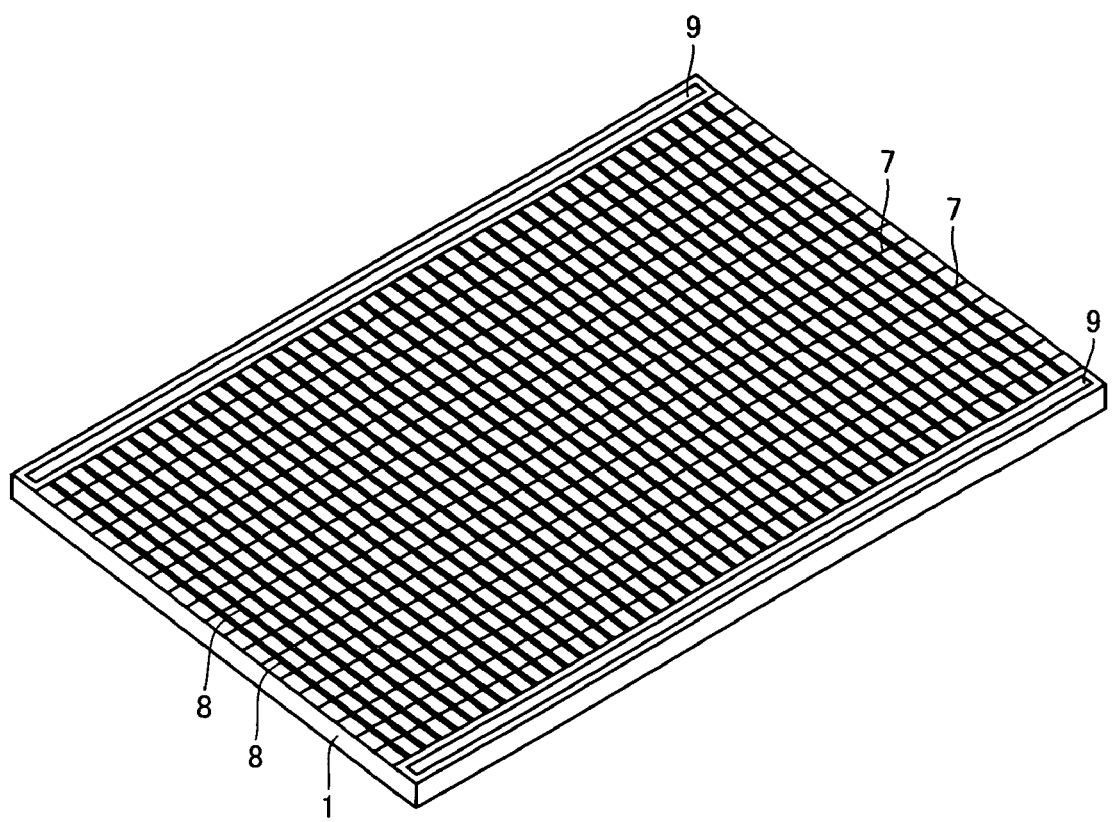
FIG. 3 is a schematic perspective view showing an appearance of a conventional thin film solar cell.

FIG. 2 is a schematic perspective cross-sectional view of another preferred example of the thin film solar cell in accordance with the present invention. The thin film solar cell is characterized in that the width D of second separation trench 12 is made narrower than the width d of the second opening trench 8a. Here, the second opening trench 8a is formed on the second separation trench 12, and therefore, the second opening trench 8a and the second separation trench 12 are provided at overlapping positions.

Figure 5A:
FIGS. 5A to 5D are schematic side views showing exemplary steps of manufacturing the thin film solar cell in accordance with the present invention.
Figure 5B:
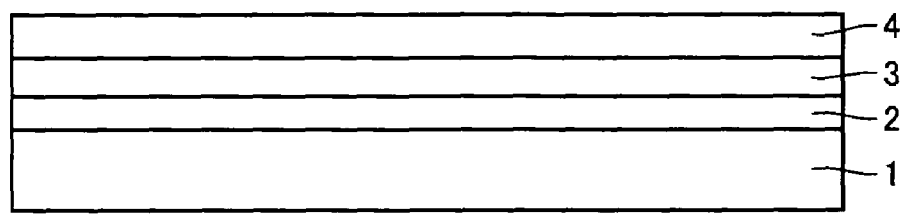

FIGS. 5A to 5D are schematic side views showing exemplary steps of manufacturing the thin film solar cell in accordance with the present invention. FIGS. 5A to 5D are schematic side views taken along the direction of arrow A of FIG. 2. First, as shown in FIG. 5A, on translucent insulating substrate 1, transparent conductive film 2 is formed. Next, as shown in FIG. 5B, on transparent conductive film 2, photoelectric conversion layer 3 and back surface electrode 4 are successively formed. Here, along the direction of arrow B of FIG. 2, after forming transparent conductive film 2 and before forming photoelectric conversion layer 3, a part of transparent conductive film 2 is removed in a strip by laser scribing, using YAG fundamental wave laser beam, so that the first separation trench 5 shown in FIG. 1 separating the transparent conductive film 2 is formed, and after forming photoelectric conversion layer 3 and before forming back surface electrode 4, a part of photoelectric conversion layer 3 is removed in a strip by laser scribing, using YAG second harmonic laser beam, so that connection trench 6 is formed.

Figure 5C:
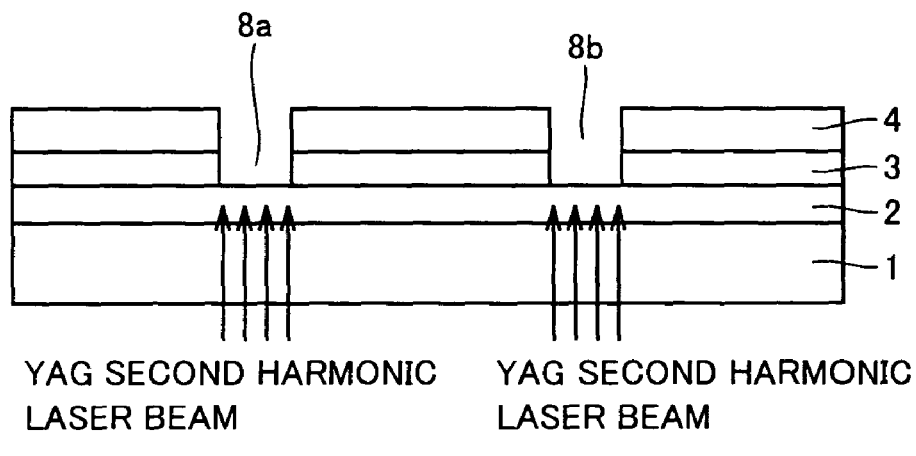

Next, as shown in FIG. 5C, by irradiation of YAG second harmonic laser beam from the side of translucent insulating substrate 1, parts of photoelectric conversion layer 3 and back surface electrode 4 are removed in strips by laser scribing, whereby the surface of transparent conductive film 2 is exposed and photoelectric conversion layer 3 and back surface electrode 4 are each separated. In this manner, the second opening trenches 8a and 8b are formed. Thereafter, by irradiation of YAG second harmonic laser beam from the side of translucent insulating substrate 1 to be orthogonal to the second opening trenches 8a and 8b, parts of photoelectric conversion layer 3 and back surface electrode 4 are removed in strips, whereby the surface of transparent conductive film 2 is exposed and photoelectric conversion layer 3 and back surface electrode 4 are each separated. Thus, the first opening trench 7 orthogonal to the second opening trenches 8a and 8b shown in FIG. 1 is formed.

Figure 5D:
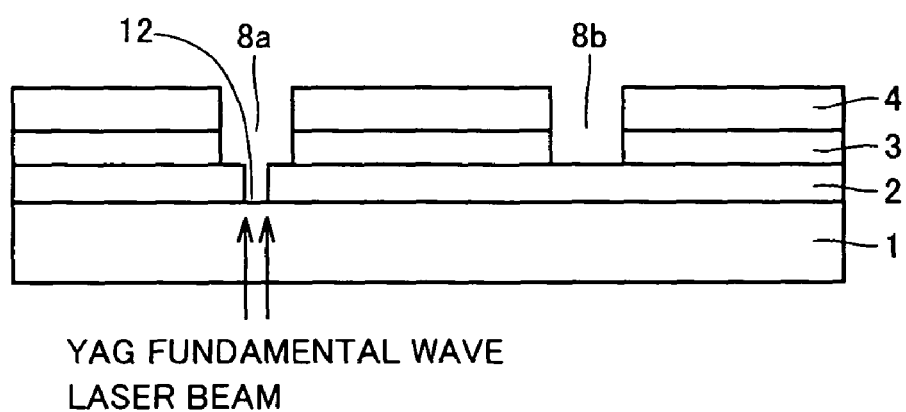
Figure 6:
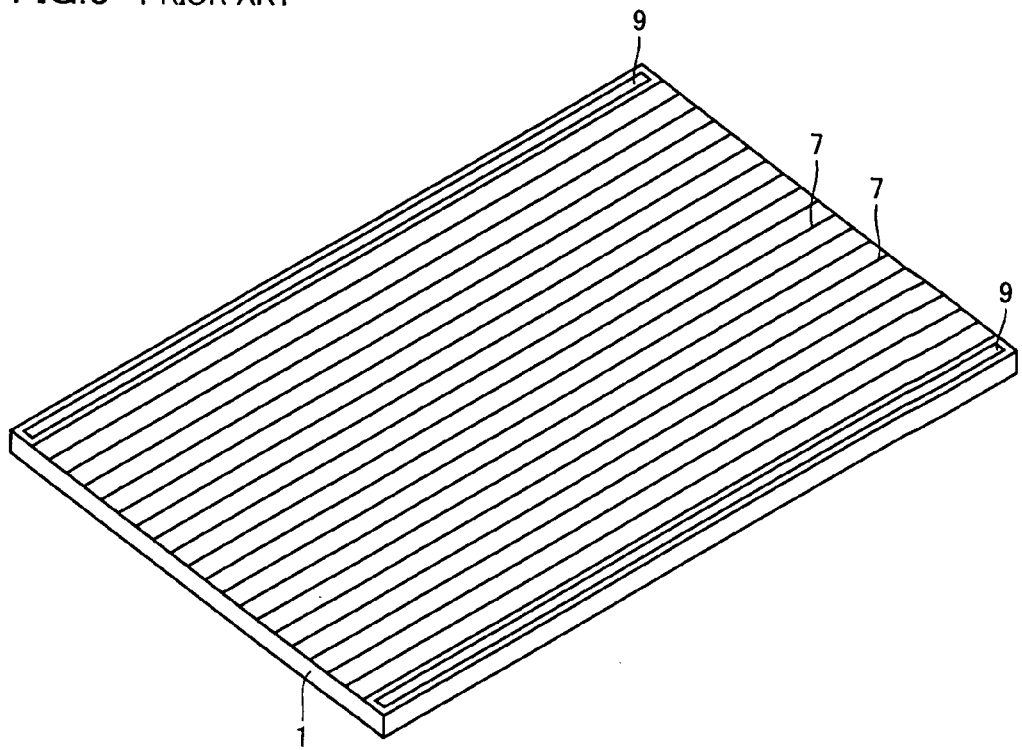
FIG. 6 is a schematic perspective view showing an appearance of a conventional thin film solar cell.
Figure 7:
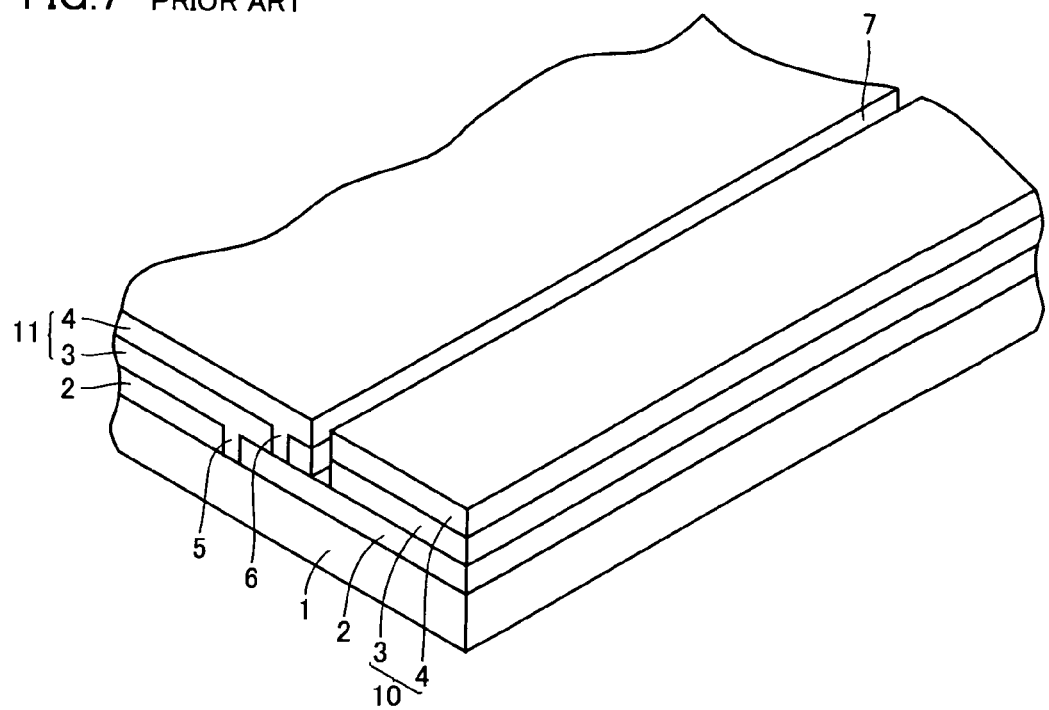
FIG. 7 is a schematic perspective cross-sectional view showing a part of the conventional thin film solar cell.

Finally, as shown in FIG. 5D, by irradiation of YAG fundamental wave laser beam from the side of translucent insulating substrate 1, a part of transparent conductive film 2 exposed in the direction of arrow A of FIG. 1 is removed in a strip by laser scribing, so that transparent conductive film 2 is separated and the second separation trench 12 is formed, and thus, the thin film solar cell shown in FIG. 2 is manufactured.

EXAMPLES

Example 1

A glass substrate (Asahi Glass, type U) with a transparent conductive film of $SnO_2$, having the size of 560 mm (width)× 925 mm (length) was prepared, and by irradiation of YAG fundamental wave laser beam from the side of the glass substrate, a part of the transparent conductive film was removed in a strip in the width direction of the glass substrate by laser scribing, whereby the second separation trench was formed. The second separation trench had the width of 300 μm, and five second separation trenches were formed at a pitch of 150 mm. Further, in the direction orthogonal to the direction of formation of the second separation trenches (along the length of the glass substrate), by irradiation of YAG fundamental wave laser beam, a part of the transparent conductive film was removed in a strip by laser scribing, and the first separation trench separating the transparent conductive film was formed. The width of the first separation trench was 100 μm, and three first separation trenches were formed at a pitch of 150 mm.

Thereafter, on the transparent conductive film and on the first and second separation trenches, a photoelectric conversion layer was formed. The photoelectric conversion layer had a tandem structure including p-layer, i-layer and n-layer of amorphous silicon and p-layer, i-layer and n-layer of micro-crystal silicon stacked successively from the side of the glass substrate. Here, the p-layer, i-layer and n-layer of amorphous silicon and p-layer, i-layer and n-layer of micro-crystal silicon are each formed by high frequency glow discharge plasma CVD method using mono-silane ($SiH_4$) as a raw material gas. The thickness of i-layer formed of amorphous silicon was 0.3 μm, and the thickness of i-layer formed of micro-crystal silicon was 2 μm. After forming the photoelectric conversion layer, a part of the photoelectric conversion layer was removed by laser scribing using the YAG fundamental wave laser beam, so that the connection trench was formed along the length of the glass substrate.

Thereafter, on the photoelectric conversion layer, a zinc oxide layer and a silver thin film were stacked by DC magnetron sputtering, to form the back surface electrode.

Finally, by laser scribing using the YAG second harmonic laser beam, parts of the photoelectric conversion layer and the back surface electrode were removed in a plurality of strips orthogonal to each other, whereby the first and second opening trenches were formed, exposing the surface of the transparent conductive film. In this manner, the thin film solar cell of Example 1, having the same structure as shown in FIG. 1 was manufactured. Here, the width of the second opening trench extending along the width direction of the glass substrate was 150 μm, and 600 second opening trenches were formed at the pitch of 1.5 mm. Aperture ratio of the second opening trenches extending along the width direction of the glass substrate was set to be 10% of the surface area of the glass substrate.

Initial efficiency (conversion efficiency immediately after manufacturing of the thin film solar cell) of the thin film solar cell of Example 1 was measured, which was 1.13 times higher than that of a solar cell formed in the similar manner as Example 1 except that five second separation trenches were not formed along the width direction of the glass substrate by removing parts of the transparent conductive film by laser scribing before forming the photoelectric conversion layer. The initial efficiency was comparable to that of the thin film solar cell described in Reference 2.

In Example 1, the conditions of irradiation of YAG fundamental wave laser beam were as follows: beam diameter was 100 μm, output was 7 W, pulse frequency was 5 kHz and sweep rate was 200 mm/sec. Separation of the transparent conductive film with the separation width of 300 μm was attained by sweeping the YAG fundamental wave laser beam four times. The conditions of irradiation of YAG second harmonic laser beam were as follows: beam diameter was 150 μm, output was 0.8 W, pulse frequency was 9 kHz and sweep rate was 500 mm/sec.

Example 2

A glass substrate (Asahi Glass, type U) with a transparent conductive film of $SnO_2$, having the size of 560 mm (width)× 925 mm (length) was prepared, and by irradiation of YAG fundamental wave laser beam from the side of the glass substrate, a part of the transparent conductive film was removed in a strip shape in the length direction of the glass substrate by laser scribing, whereby the first separation trench was formed. The first separation trench had the width of 80 μm, and four first separation trenches were formed at a pitch of 150 mm.

Thereafter, on the transparent conductive film and on the first separation trenches, a photoelectric conversion layer was formed. The photoelectric conversion layer had a tandem structure including p-layer, i-layer and n-layer of amorphous silicon and p-layer, i-layer and n-layer of micro-crystal silicon stacked successively from the side of the glass substrate. Here, the p-layer, i-layer and n-layer of amorphous silicon and p-layer, i-layer and n-layer of micro-crystal silicon are each formed by high frequency glow discharge plasma CVD method using mono-silane ($SiH_4$) as a raw material gas. The thickness of i-layer formed of amorphous silicon was 0.3 μm, and the thickness of i-layer formed of micro-crystal silicon was 2 μm. After forming the photoelectric conversion layer, a part of the photoelectric conversion layer was removed by laser scribing using the YAG fundamental wave laser beam, so that the connection trench was formed along the length of the glass substrate.

Thereafter, on the photoelectric conversion layer, a zinc oxide layer and a silver thin film were stacked by DC magnetron sputtering, to form the back surface electrode.

Thereafter, by laser scribing using the YAG second harmonic laser beam, parts of the photoelectric conversion layer and the back surface electrode were removed in a plurality of strips orthogonal to each other, whereby the first and second opening trenches were formed, exposing the surface of the transparent conductive film. Here, 600 second opening trenches, each having the width of 150 μm, were formed along the width direction of the glass substrate, at a pitch of 1.5 mm. Aperture ratio of the second opening trenches was set to be 10% of the surface area of the glass substrate. Further, by irradiation of the YAG fundamental wave laser beam from the side of glass substrate, parts of the transparent conductive film were removed in five second opening trenches, at a distance of 150 mm from each other, among these 600 second opening trenches, whereby the second separation trenches having the width of 80 μm were formed.

Finally by laser scribing using the YAG second harmonic laser beam, parts of the photoelectric conversion layer and the back surface electrode were removed in strips to expose part of the surface of transparent conductive film, and the first opening trenches extending in the length direction of the glass substrate were formed. Consequently, the thin film solar cell of Example 2, having the same structure as shown in FIG. 2 was manufactured.

Initial efficiency (conversion efficiency immediately after manufacturing of the thin film solar cell) of the thin film solar cell of Example 2 was measured, which was 1.11 times higher than that of a solar cell formed in the similar manner as Example 2 except that the second separation trenches were not formed. The initial efficiency was comparable to that of the thin film solar cell described in Reference 2.

In Example 2, the conditions of irradiation of YAG fundamental wave laser beam were as follows: beam diameter was 80 μm, output was 7 W, pulse frequency was 5 kHz and sweep rate was 200 mm/sec. The conditions of irradiation of YAG second harmonic laser beam were as follows: beam diameter was 150 μm, output was 0.8 W, pulse frequency was 9 kHz and sweep rate was 500 mm/sec.

Thus, the present invention can provide a thin film solar cell, including: a transparent conductive film arranged on a translucent insulating substrate; first and second separation trenches orthogonal to each other on the translucent insulating substrate and separating the transparent conductive film into a plurality of pieces; and at least one first opening trench parallel to the first separation trench and at least two second opening trenches parallel to the second separation trench, orthogonal to each other on the translucent insulating substrate; wherein solar cells including a photoelectric conversion layer and a back surface electrode formed on the translucent insulating substrate are arranged at adjacent positions with the first opening trench positioned therebetween and at adjacent positions with the second opening trench positioned therebetween; pairs of the solar cells adjacent to each other with the first opening trench positioned therebetween are electrically connected as the photoelectric conversion layer of one solar cell and the back surface electrode of the other solar cell are in contact with the transparent conductive film; and pairs of solar cells positioned adjacent to each other with the second opening trench positioned therebetween include pairs of solar cells that are electrically connected to each other with the transparent conductive film in contact with the photoelectric conversion layer of one solar cell and the transparent conductive film in contact with the photoelectric conversion layer of the other solar cell being not separated by the second separation trench, and pairs of solar cells that are electrically insulated from each other with the transparent conductive film in contact with the photoelectric conversion layer of one solar cell and the transparent conductive film in contact with the photoelectric conversion layer of the other solar cell being separated by the second separation trench. Therefore, high production yield can be attained, and even when short-circuit occurs in the photoelectric conversion layer, decrease in conversion efficiency can be suppressed. The thin film solar cell of the present invention as described above can suitably be used as a see-through type thin film solar cell that transmits light entering from the side of the translucent insulating substrate through the first and second opening trenches.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film solar cell, comprising:
   a transparent conductive film arranged on a translucent insulating substrate;
   first and second separation trenches orthogonal to each other on said translucent insulating substrate and separating said transparent conductive film into a plurality of pieces; and
   at least one first opening trench parallel to said first separation trench and at least two second opening trenches parallel to said second separation trench, wherein the at least one opening trench is orthogonal to the at least two second opening trenches, wherein
   solar cells including a photoelectric conversion layer and a back surface electrode formed on said translucent insulating substrate are arranged at adjacent positions with said first opening trench positioned therebetween and at adjacent positions with said second opening trench positioned therebetween;

a first pair of solar cells, wherein adjacent solar cells within the first pair are separated by the first opening trench and are electrically connected as the photoelectric conversion layer of one solar cell and the back surface electrode of the other adjacent solar cell are in contact with the transparent conductive film via a connection trench;

a second pair of solar cells including a first solar cell and a second solar cell positioned adjacent to each other with one of the second opening trenches therebetween, wherein the first solar cell and the second solar cell are electrically connected each other via the transparent conductive film which is in contact with the photoelectric conversion layer of the first solar cell and the photoelectric conversion layer of the second solar cell, and the first solar cell and the second solar cell are not separated by the second separation trench; and a third pair of solar cells including the second solar cell and a third solar cell, wherein the second solar cell and the third solar cell are insulated form each other by the second separation trench and the other of the second opening trenches, and the transparent conductive film in contact with the photoelectric conversion layer of the second solar cell is separated from the transparent conductive film in contact with the photoelectric conversion layer of the third solar cell by the second separation trench.

2. The thin film solar cell according to claim 1, wherein said photoelectric conversion layer includes a layer of micro-crystal silicon.

3. The thin film solar cell according to claim 1, wherein said photoelectric conversion layer has a tandem structure including a layer of amorphous silicon and a layer of micro-crystal silicon.

4. The thin film solar cell according to claim 1, wherein said first separation trench and the first opening trench are provided at positions not overlapping with each other, and the second separation trench and the second opening trench are provided at overlapping positions.

5. The thin film solar cell according to claim 1, wherein the width of said second separation trench is different from the width of said second opening trench.

* * * * *